United States Patent
Zhang et al.

(10) Patent No.: US 11,190,132 B2
(45) Date of Patent: Nov. 30, 2021

(54) PHOTOCURRENT SCANNING SYSTEM

(71) Applicants: Tsinghua University, Beijing (CN); HON HAI PRECISION INDUSTRY CO., LTD., New Taipei (TW)

(72) Inventors: Ke Zhang, Beijing (CN); Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/249,308

(22) Filed: Jan. 16, 2019

(65) Prior Publication Data

US 2019/0245484 A1     Aug. 8, 2019

(30) Foreign Application Priority Data

Feb. 7, 2018   (CN) .......................... 201810123474.3

(51) Int. Cl.
*H02S 50/15* (2014.01)
*G01R 13/34* (2006.01)
*G01R 19/00* (2006.01)

(52) U.S. Cl.
CPC ............ *H02S 50/15* (2014.12); *G01R 13/347* (2013.01); *G01R 19/0092* (2013.01)

(58) Field of Classification Search
CPC ............ G01R 31/2656; G01R 31/2831; G01R 19/0092; G01R 13/347; G01R 31/2648; G01R 13/34; G01R 19/00; H02S 50/15
See application file for complete search history.

(56) References Cited

U.S. PATENT DOCUMENTS

| | | | | |
|---|---|---|---|---|
| 4,456,879 A | * | 6/1984 | Kleinknecht | G01R 31/2656 117/85 |
| 6,603,537 B1 | * | 8/2003 | Dietz | G01N 15/1475 356/39 |
| 7,019,311 B1 | | 3/2006 | Horn | |
| 2005/0196882 A1 | * | 9/2005 | Steeples | G01R 31/2656 438/16 |
| 2010/0255518 A1 | | 10/2010 | Goix et al. | |
| 2011/0045660 A1 | * | 2/2011 | Romano | H01L 29/0673 438/478 |

FOREIGN PATENT DOCUMENTS

| | | |
|---|---|---|
| CN | 1793874 | 6/2006 |
| CN | 101438146 | 5/2009 |
| CN | 101718696 | 6/2010 |
| CN | 106908428 | 6/2017 |

\* cited by examiner

*Primary Examiner* — Jermele M Hollington
*Assistant Examiner* — Suresh K Rajaputra
(74) *Attorney, Agent, or Firm* — ScienBiziP, P.C.

(57) ABSTRACT

A photocurrent scanning system comprises a laser generating device, a focusing device, a displacement adjustment device, a bias supply device, and a measuring device. The laser generating device is used to emit a laser. The focusing device is used to focus the laser to a surface of a sample. The displacement adjustment device is used to place the sample and adjust a position of the sample, to make the laser focused onto different parts of the surface of the sample. The bias supply device is used to supply a voltage to the sample. The measuring device is used to measure a photocurrent signal flowing through the sample.

20 Claims, 4 Drawing Sheets

PHOTOCURRENT SCANNING SYSTEM

CROSS-REFERENCE TO RELATED APPLICATIONS

This application claims all benefits accruing under 35 U.S.C. § 119 from China Patent Application No. 201810123474.3, filed on Feb. 7, 2018, in the China National Intellectual Property Administration, the contents of which are hereby incorporated by reference.

FIELD

The present disclosure relates to a photocurrent scanning system.

BACKGROUND

In conventional technology, galvanometer systems are often used to realize scanning. In the galvanometer systems, two scanning mirrors are placed opposite to each other, in which an angle is formed between the two scanning mirrors. A laser is sequentially irradiated onto a workpiece to be tested by the two scanning mirrors. During the scanning process, a position of the laser irradiated on the workpiece to be tested is changed by controlling the directions of the two scanning mirrors However, the galvanometer system keeps the workpiece to be tested stationary, and performs the scan by changing a laser path, the galvanometer system belongs to an off-axis system. Therefore, a spot that is irradiated to the workpiece to be tested is large, thereby affecting a scanning accuracy of the galvanometer system.

Therefore there is a room for an improvement.

BRIEF DESCRIPTION OF THE DRAWINGS

Implementations of the present technology will now be described, by way of example only, with reference to the attached figures, wherein.

DETAILED DESCRIPTION

Figure 1:
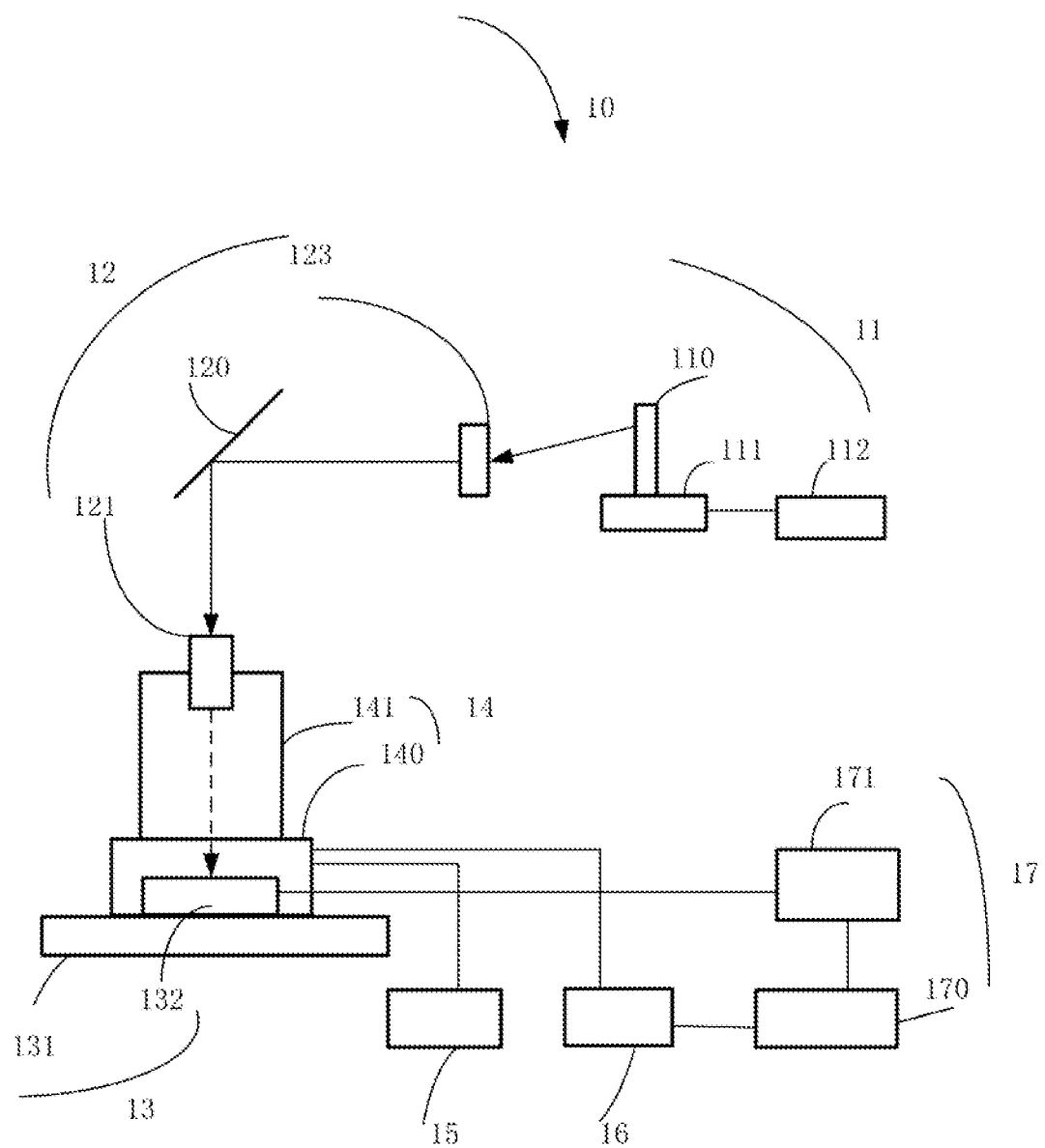
FIG. 1 is a structure schematic diagram of one embodiment of a photocurrent scanning system.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

FIG. 1 shows one embodiment of the present application in relation to a photocurrent scanning system 10. The photocurrent scanning system 10 comprises a laser generating device 11, a focusing device 12, a displacement adjustment device 13, a protection device 14, a bias supply device 15, a measuring device 16, and a visual device (not shown). The laser generating device 11 is used to emit a laser. The laser is focused by the focusing device 12 onto a surface of a sample placed in the displacement adjustment device 13. The displacement adjustment device 13 is used to adjust a location of the sample, to make the laser focused onto different parts of the surface of the sample. The bias supply device 15 is used to supply a voltage to the sample. The measuring device 16 is used to measure a photocurrent signal flowing through the sample.

A structure of the laser generating device 11 is not limited to the description above. In one embodiment, the laser generating device 11 comprises a laser element 110, a mounting base 111 and a laser controller 112. The laser element 110 is located on the mounting base 111. The laser controller 112 matches with the mounting base 111. The laser controller 112 is used to control a temperature and a power of an output laser in the laser element 110. The laser element 110 can be selected according to actual needs. For example, the specifications of the laser element 110 can have a wavelength of 405 nm and a power of 10 mW, a wavelength of 520 nm and a power of 15 mW, or a wavelength of 635 nm and a power of 8 mW. In one embodiment, the laser element 110 is a diode laser, a type of the mounting base 111 is LDM9LP, and a type of the laser controller 112 is ITC4001.

The laser generating device 11 introduces the laser into the focusing device 12 through an optical fiber. The optical fiber comprises a first end and a second end opposite to the first end. The first end is connected to the laser element 110, and the second end is connected to the focusing device 12. In one embodiment, the optical fiber is a single mode fiber; the laser input to the focusing device 12 through the single mode fiber is irradiated onto the surface of the sample to form a small spot. A diameter of the spot ranges from about 1 micrometer to about 2 micrometers. The single mode fiber and a laser of a corresponding wavelength are corollary used with each other.

The focusing device 12 comprises an objective lens 121, and the objective lens 121 is used to focus the laser. The laser emitted by the laser generating device 11 is focused by the objective lens 121 onto the surface of the sample placed in the displacement adjustment device 13. A structure of the objective lens 121 is not limited. In one embodiment, a magnification of the objective lens 121 is 100 times.

In one embodiment, the focusing device 12 further comprises a collimating mirror 123. The collimating mirror 123 is located at the second end of the optical fiber. The collimating mirror 123 is used to collimate the laser from the optical fiber.

In one embodiment, a laser path of the laser generating device 11 cannot directly enter the objective lens 121; in such case, the focusing device 12 further comprises a reflective mirror 120 to change the laser path.

The displacement adjustment device 13 comprises a stage 131 and a displacement stage 132. The displacement stage 132 is fixed to the stage 131. The sample is placed on the displacement stage 132. Both the stage 131 and the displacement stage 132 can be movable, and the displacement stage 132 can be driven by the stage 131. The stage 131 can first adjust the position of the sample in a general direction, and the displacement stage 132 can further fine-tune the position of the sample; thereby finding a scanning range of the sample.

In one embodiment, the displacement stage 132 is a piezoelectric ceramic displacement stage, in which a model of the piezoelectric ceramic displacement stage is P-733.3CD, a scanning range of the piezoelectric ceramic displacement stage is 100 µm×100 µm×10 µm, and a movement accuracy of the piezoelectric ceramic displacement stage is about 0.1 nm.

A structure of the bias supply device 15 is not limited to above, as long as an external bias can be supplied to the sample. A structure of the measuring device 16 is not limited to above, as long as it can measure a photocurrent flowing through the sample. In one embodiment, the bias supply device 15 and the measuring device 16 are integrated in a source meter; the source meter can also measure the photocurrent flowing through the sample while providing a bias voltage to the sample. A model of the source meter is not limited. In one embodiment, the model of the source meter is Agilent B2902A.

The protection device 14 can be optional. When the obtained photocurrent signal is noisy, the protection device 14 can prevent an external electromagnetic interference during a scanning process. In one embodiment, the protection device 14 comprises a storage box 140 and a shielding cylinder 141. The storage box 140 is fixed to the stage 131, and the displacement stage 132 is fixed in the storage box 140. The storage box 140 is used to protect the displacement stage 132 and shield the external interference. A material of each of the storage box 140 and the shielding cylinder 141 is a material capable of shielding electromagnetic energy. The material of each of the storage box 140 and the shielding cylinder 141 can be the metal materials such as silver, copper or aluminum.

The storage box 140 comprises an upper cover, in which the upper cover can be detachable, and the upper cover comprises a through hole. The through hole is used to transmit the laser to the surface of the sample on the displacement stage 132. A side wall of the storage box 140 comprises at least three interfaces. Each of the at least three interfaces can be a three-axis interface or a two-axis interface. In one embodiment, the side wall of the storage box 140 comprises three interfaces, and one electrode line is through each of the three interfaces, therefore, three electrode lines are through the three interfaces. Each electrode line comprises a first end and a second end opposite to the first end, the first ends of the electrode lines are electrically connected to the bias supply device 15 and the measuring device 16, and the second ends of the electrode lines are electrically connected to the sample in the storage case 140.

In one embodiment, the three interfaces are all three-axis interfaces to provide excellent shielding effect.

Figure 2:
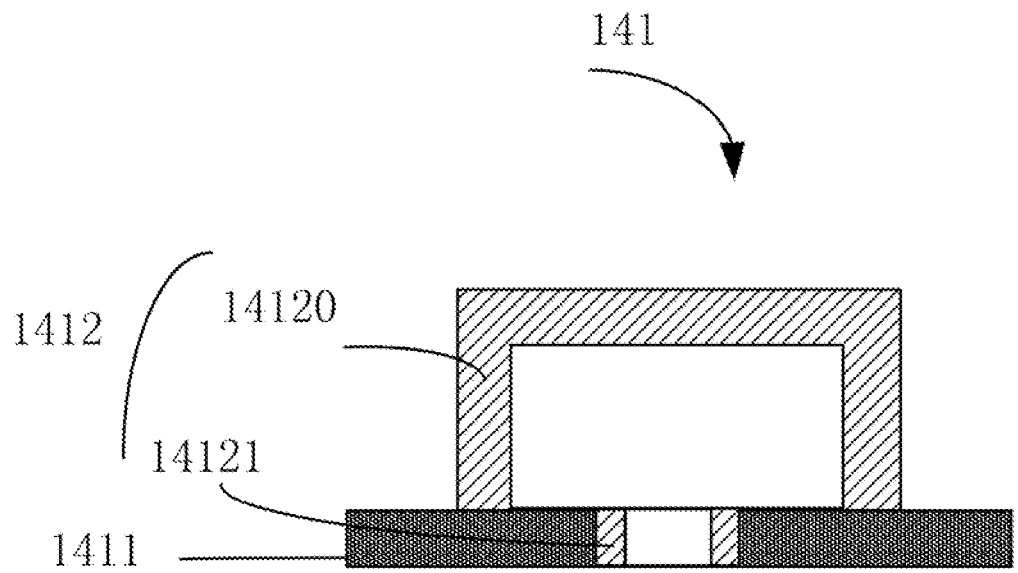
FIG. 2 is a schematic view of a shielding cylinder of the photocurrent scanning system in FIG. 1.

The shielding cylinder 141 is located between the objective lens 121 and the storage case 140. A structure of the shielding cylinder 141 is not limited to above, as long as it can shield the external electromagnetic interference received by the laser during transferring from the focusing device 12 to the surface of the sample. The shielding cylinder 141 can be an integrated structure or a divided structure. FIG. 2 shows the shielding cylinder 141 of one embodiment comprises an annular piece 1411 and a sleeve 1412. The annular piece 1411 is located on the upper cover of the storage box, and an opening of the annular piece 1411 corresponds to the through hole of the upper cover. A diameter of the opening of the annular piece 1411 is smaller than a diameter of the through hole of the upper cover.

The sleeve 1412 is an integrated structure. The sleeve 1412 comprises a first hollow cylinder 14120 and a second hollow cylinder 14121. An outer diameter of the second hollow cylinder 14121 is smaller than an outer diameter of the first hollow cylinder 14120, to form a boss on an outer surface of the sleeve 1412. The outer diameter of the second hollow cylinder 14121 is smaller than the diameter of the opening of the annular piece 1411, and the outer diameter of the first hollow cylinder 14120 is larger than the diameter of the opening of the annular piece 1411. An inner diameter of the first hollow cylinder 14120 is larger than an outer diameter of the objective lens 121. The sleeve 1412 is located on the annular piece 1411, and the boss of the outer surface of the sleeve 1412 is stuck in the opening of the annular piece 1411. The second hollow cylinder 14121 is located in the opening of the annular piece 1411.

The visual device can be optional. The visual device is used to observe the position of the sample. A structure of the visual device is not limited. The visual device can be a camera. In one embodiment, the focusing device 12 is an optical microscope, and the photocurrent scanning system 10 does not include the visual device.

In one embodiment, the photocurrent scanning system 10 further comprises a control device 17. The control device 17 comprises a computer processing unit 170 and a displacement stage control unit 171. The computer processing unit 170 is connected to the displacement stage control unit 171 through a first electrode line. The computer processing unit 170 is connected to the measuring device 16 through a second electrode line. The computer processing unit 170 is used to control the measuring device 16 to synchronously measure the photocurrent flowing in the sample for each movement of the displacement stage 132. The displacement stage control unit 171 is used to control the movement of the displacement stage 132. In one embodiment, the computer processing unit 170 is present in a computer. A displacement range and a moving step length of the displacement stage 132, the bias voltage $V_{GS}$, and the bias $V_{DS}$ can be set in according to the actual needs in the computer.

The sample is placed on a driving portion of the displacement stage 132. The sample can be moved under the drive of the displacement stage 132. Therefore, the position of the sample can be coarsely adjusted by the stage 131, and then the position of the sample can be finely adjusted by the displacement stage 132. Since the position of the sample can be adjusted by the stage 131 and the displacement stage 132, the laser can be irradiated to different positions on the surface of the sample, and a purpose of scanning is achieved. A motion track of the sample is not limited. In one embodiment, the motion track of the sample is "⊐". In one embodiment, the sample moves in the same direction, the motion track of the sample is "☰". A material of the sample is not limited, as long as it can generate a photocurrent signal under the optical signal. Such as photosensitive materials or photovoltaic materials.

Figure 3:
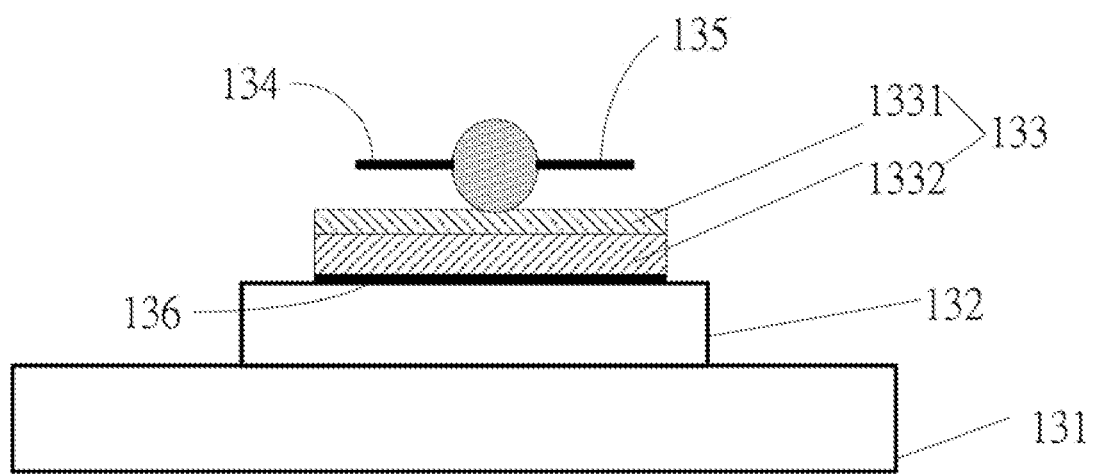
FIG. 3 is a structure schematic diagram of one embodiment of a sample located on a carrier.

At least one electrode can be located on the sample, and each of the at least one electrode is connected to one of the at least three interfaces located on the side wall of the storage box 140 through an electrode wire. In some embodiments, because the size of the sample is small as in a micrometer level, the sample cannot be placed directly on the displacement stage 132, and therefore, referring to the FIG. 3, the sample needs to be located on a carrier 133. In one embodiment, providing a silicon dioxide layer 1331 on a silicon substrate 1332; putting the sample on the silicon dioxide layer 1331; and leading two electrodes from the sample, the two electrodes are a first source 134 and a first drain 135, and a first gate 136 is located on the silicon substrate. A substrate is fixed on a driving portion of the displacement stage 132, and an insulating plate is located on the substrate. Three electrode points are provided at an edge of the insulating plate, and the three electrode points are a second source, a second gate and a second drain, respectively. One electrode line is leaded from each electrode point, and three electrode lines can be leaded, one end of the three electrode lines is electrically connected to the first source, the first gate, and the first drain on the sample, respectively, and the other end of the three electrode lines is electrically connected to the interfaces of the side wall of the storage box 140.

When the photocurrent scanning system 10 measures a photocurrent of the sample, the laser is emitted from the laser generating device 11 and focused to the surface of the sample by the focusing device 12; a voltage is supplied to the sample by the bias supply device 15; the sample is moved by the displacement adjustment device 13 to irradiate the laser to different positions on the surface of the sample, and the photocurrent signal of the sample is measured by the measuring device 16.

In one embodiment, the laser emitted from the laser generating device 10 is irradiated to the reflective mirror 120 and reflected to the objective lens 121, and then enters the storage box 140 through the objective lens 121. The shielding cylinder 141 shields the external electromagnetic interference between the objective lens 121 and the storage box 140. The position of the sample is coarse adjusted by moving the stage 131 and fine adjusted by moving the displacement stage 132, to keep the laser within the scanning range of the sample. After the scanning range is found, the displacement stage controller 171 controls the movement of the displacement stage 132 to drive the sample to move along a certain trajectory, thereby implementing scanning. During the scanning process, the computer synchronously collects the photocurrent on the surface of the sample.

During the scanning process, the laser is kept still, and the movement of the sample is controlled to implement scanning. The photocurrent scanning system 10 introduces a laser optical path through an optical fiber, the optical path is simple. The photocurrent scanning system 10 is a coaxial system, which is capable of improving the scanning accuracy of the photocurrent scanning system 10.

Figure 4:
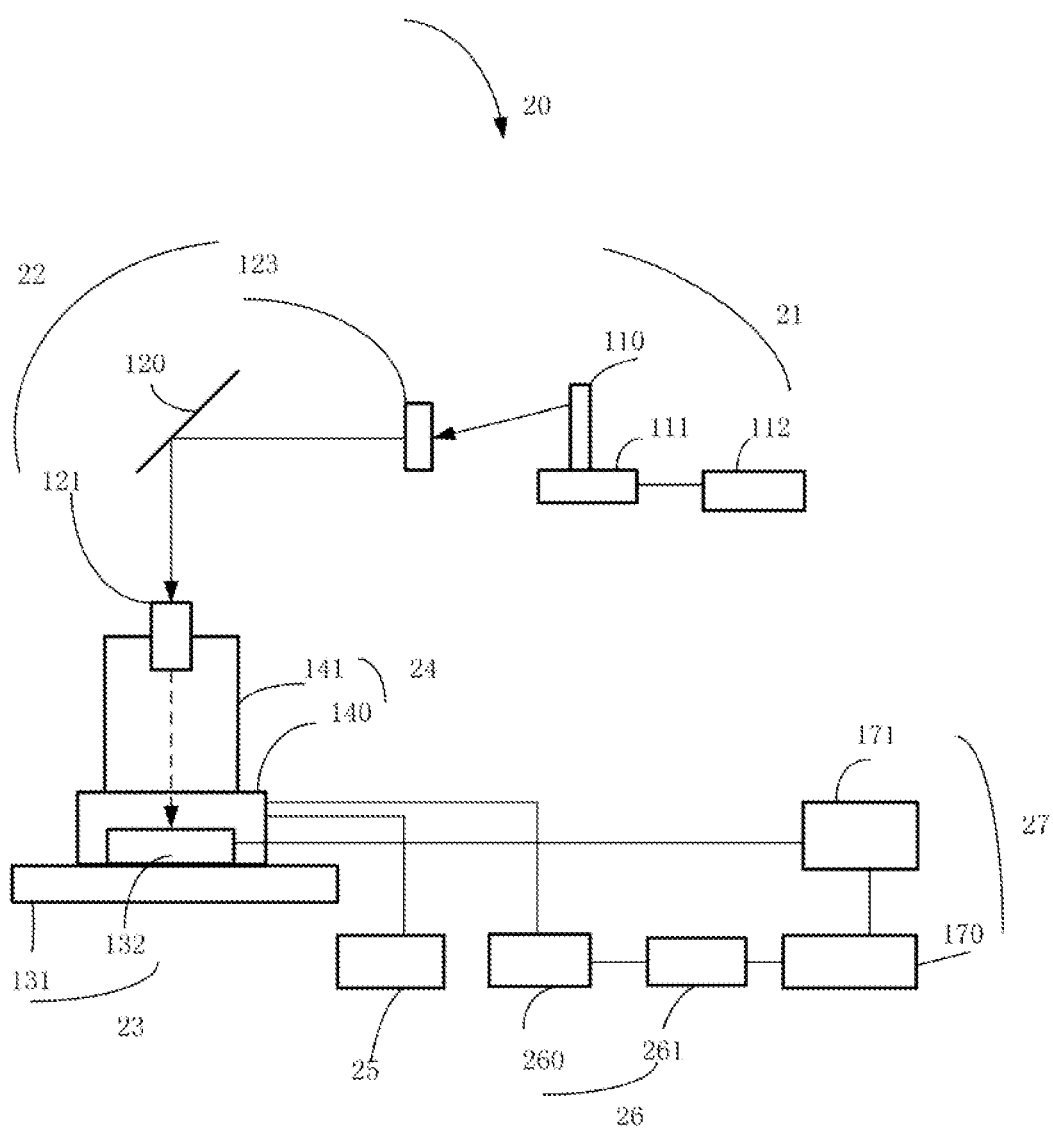
FIG. 4 is a structure schematic diagram of one embodiment of a photocurrent scanning system.

A photocurrent scanning system 20 according to another embodiment is provided. The photocurrent scanning system 20 adopts a phase-locked technique to extract a photocurrent signal from a noise signal. The photocurrent scanning system 20 can be used when a measured photocurrent signal is submerged in the noise signal. FIG. 4 shows that the photocurrent scanning system 20 comprises a laser generating device 21, a focusing device 22, a displacement adjustment device 23, a protection device 24, a bias supply device 25, a measuring device 26, a control device 27 and a visual device (not shown).

Characteristics of the laser generating device 21 is the same as the laser generating device 11 discussed above.

Characteristics of the focusing device 22 is the same as the focusing device 22 discussed above.

Characteristics of the displacement adjustment device 23 is the same as the displacement adjustment device 13 discussed above.

Characteristics of the protection device 24 is the same as the protection device 14 discussed above.

Characteristics of the control device 27 is the same as the control device 17 discussed above.

The measuring device 26 and the bias supply device 25 are not integrated in a source meter. The measuring device 26 comprises a current preamplifier 260 and a phase-locked amplifier 261. The current preamplifier 260 is used to amplify a photocurrent of the sample. The phase-locked amplifier 261 is used to extract a photocurrent signal amplified by the current preamplifier 260. The bias supply device 25 is a source meter, the source meter is used to provide an external bias to the sample but not used to measure a photocurrent flowing through the sample.

The phase-locked amplifier 261 is connected to the current preamplifier 260 and a laser controller. A working principle of the measuring device 26 is described as follows: the photocurrent signals are converted into the voltage signals and outputted to the phase-locked amplifier 261 by the current preamplifier 260; a frequency of the laser is outputted to the phase-locked amplifier 261; a voltage signal corresponding to the frequency of the laser is filtered out from the voltage signals and outputted by the phase-locked amplifier 261; and then the voltage signal corresponding to the frequency of the laser is converted to a photocurrent signal based on a sensitivity set on the current preamplifier 260.

Since the measuring device 26 and the bias supply device 25 are not integrated in a source meter, the number of interfaces on the protection device 24 is more than the number of interfaces on the protection device 14. In one embodiment, four interfaces are located on the protection device 24, the four interfaces are defined as a first interface, a second interface, a third interface, and a fourth interface. The first interface, the second interface, and the third interface are as source, drain and gate respectively, and the source, drain and gate are connected to the source meter; and the fourth interface is electrically connected to the current preamplifier 260. Since the phase-locked amplifier 261 can only be connected to a two-axis interface, the fourth interface electrically connected to the current preamplifier 260 is the two-axis interface.

In one embodiment, the photocurrent scanning system 20 further comprises an oscilloscope (not shown). The oscilloscope is used to display the photocurrent signal extracted by the phase-locked amplifier 261.

In the photocurrent scanning system 20, the photocurrent signals can be amplified by the current preamplifier 260, and only the photocurrent signals can be extracted from the amplified photocurrent signals comprising large noise signals by the phase-locked amplifier 261. The photocurrent scanning system 20 can be applied to the photocurrent signals comprising large noise signals, thereby improving the accuracy of the photocurrent signal.

The above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A photocurrent scanning system comprising:
a laser generating device configured to emit a laser;
a focusing device configured to focus the laser to a surface of a sample, wherein the sample is located on a carrier, the carrier is a silicon substrate coated with a silicon dioxide layer, and a source and a drain are lead from the sample, and a gate is located on the silicon substrate;
a displacement adjustment device, wherein the carrier is located on the displacement adjustment device, the displacement adjustment device is movable to make the laser focused onto different parts of the surface of the sample;
a bias supply device configured to supply a voltage to the sample; and
a measuring device configured to measure a photocurrent signal flowing through the sample.

2. The photocurrent scanning system of claim 1, wherein the focusing device comprises an objective lens being configured to focus the laser.

3. The photocurrent scanning system of claim 1, wherein the laser is introduced into the focusing device through an optical fiber, the optical fiber comprises a first end and a second end opposite to the first end, the first end is connected to the laser generating device, and the second end is connected to the focusing device.

4. The photocurrent scanning system of claim 3, wherein the focusing device further comprises a collimating mirror located at the second end of the optical fiber.

5. The photocurrent scanning system of claim 1, wherein a diameter of the spot ranges from about 1 micrometer to about 2 micrometers.

6. The photocurrent scanning system of claim 1, wherein the displacement adjustment device comprises a stage and a displacement stage, the displacement stage is fixed to the stage, and the sample is placed on the displacement stage.

7. The photocurrent scanning system of claim 6, wherein a location of the sample is coarsely adjusted by the stage, and then the location of the sample is finely adjusted by the displacement stage.

8. The photocurrent scanning system of claim 7, further comprising a protection device comprising a storage box and a shielding cylinder; wherein the storage box is fixed to the stage and the displacement stage is fixed in the storage box.

9. The photocurrent scanning system of claim 8, wherein the storage box comprises a detachable upper cover, and the detachable upper cover comprises a through hole.

10. The photocurrent scanning system of claim 8, wherein a side wall of the storage box comprises at least three interfaces.

11. The photocurrent scanning system of claim 10, wherein each of the at least three interfaces is a three-axis interface or a two-axis interface.

12. The photocurrent scanning system of claim 10, wherein an electrode line gets through each of the at least three interfaces to obtain at least three electrode lines, the electrode line comprises a first end and a second end opposite to the first end, the first ends of the at least three electrode lines are electrically connected to the bias supply device and the measuring device, and the second ends of the at least three electrode lines are electrically connected to the sample.

13. The photocurrent scanning system of claim 6, further comprising a control device, wherein the control device comprises a computer processing unit and a displacement stage control unit.

14. The photocurrent scanning system of claim 13, wherein the computer processing unit is configured to control the measuring device to synchronously measure the photocurrent flowing in the sample, and the displacement stage control unit is configured to control a movement of the displacement stage.

15. The photocurrent scanning system of claim 1, wherein the bias supply device and the measuring device are integrated in a source meter, and the source meter is configured to measure the photocurrent flowing through the sample and provide the bias voltage to the sample at the same time.

16. The photocurrent scanning system of claim 1, wherein the bias supply device is a source meter.

17. The photocurrent scanning system of claim 16, wherein the measuring device comprises a current preamplifier and a phase-locked amplifier; the current preamplifier is configured to amplify the photocurrent of the sample, and the phase-locked amplifier is configured to extract a photocurrent signal amplified by the current preamplifier.

18. The photocurrent scanning system of claim 17, wherein a plurality of photocurrent signals are converted into a plurality of voltage signals and outputted to the phase-locked amplifier by the current preamplifier; a frequency of the laser is outputted to the phase-locked amplifier; a voltage signal of the plurality of voltage signals corresponding to the frequency of the laser is defined a first voltage signal, the first voltage signal is filtered out from the plurality of voltage signals and outputted by the phase-locked amplifier; and then the first voltage signal is converted to a photocurrent signal based on a sensitivity set on the current preamplifier.

19. The photocurrent scanning system of claim 1, wherein a size of the sample in all directions is in a micrometer level.

20. The photocurrent scanning system of claim 1, wherein the laser generating device comprises a laser element, and the laser element have a wavelength of 405 nm and a power of 10 mW, a wavelength of 520 nm and a power of 15 mW, or a wavelength of 635 nm and a power of 8 mW.

* * * * *